US006738880B2

(12) United States Patent
Lai et al.

(10) Patent No.: US 6,738,880 B2
(45) Date of Patent: May 18, 2004

(54) BUFFER FOR VARYING DATA ACCESS SPEED AND SYSTEM APPLYING THE SAME

(75) Inventors: Jiin Lai, Taipei (TW); Chia-Hsin Chen, Taipei (TW); Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 245 days.

(21) Appl. No.: 09/878,896

(22) Filed: Jun. 11, 2001

(65) Prior Publication Data

US 2001/0052057 A1 Dec. 13, 2001

Related U.S. Application Data

(60) Provisional application No. 60/211,095, filed on Jun. 12, 2000.

(30) Foreign Application Priority Data

Aug. 18, 2000 (TW) .......................................... 89116720 A

(51) Int. Cl.[7] .............................................. G06F 13/00
(52) U.S. Cl. ..................... 711/167; 711/157; 710/58; 710/60
(58) Field of Search ................. 711/167, 157, 711/105, 154; 710/60, 58

(56) References Cited

U.S. PATENT DOCUMENTS

| 6,003,118 A | * | 12/1999 | Chen ........................... 711/167 |
| 6,366,989 B1 | * | 4/2002 | Keskar et al. ............... 711/167 |
| 6,530,006 B1 | * | 3/2003 | Dodd et al. .................. 711/167 |

OTHER PUBLICATIONS

Cosoroaba, Adrian B. "Double Data Rate Synchronous DRAMs in High Performance Applications" WESCON/97 Conference Proceedings. IEEE, 1997. pp. 387–391.*

* cited by examiner

Primary Examiner—Reba I. Elmore
(74) Attorney, Agent, or Firm—J. C. Patents

(57) ABSTRACT

A buffer for varying data access speed. Combining the buffer with a memory such as a double data rate synchronous dynamic random access memory, the data transmission rate of a memory system can be enhanced. The buffer is coupled with a control chip set and several memory modules to provide functions of data analysis and assembly to satisfy a two-way data transmission interface and to obtain a higher data transmission rate. The buffer also has the function of isolating the electric connection between two sides. A single signal interface from a memory module can be converted to a complementary source synchronous signal by the buffer, so that a high-speed data transmission can be achieved. A memory system can apply several of such buffers to achieve an even higher data transmission speed.

33 Claims, 10 Drawing Sheets

BUFFER FOR VARYING DATA ACCESS SPEED AND SYSTEM APPLYING THE SAME

CROSS-REFERENCE TO RELATED APPLICATION

This application claims the priority benefit of U.S. provisional application serial No. 60/211,095, filed Jun. 12, 2000, and Taiwan application serial no. 89116720, filed Aug. 18, 2000.

BACKGROUND OF THE INVENTION

1. Field of the Invention

The invention relates in general to a buffer in a memory access system. More particularly, the invention relates to a buffer in a motherboard used for enhancing data access speed of memories.

2. Description of the Related Art

In recent years, dynamic random access memory (DRAM) has evolved from the earliest non-synchronous dynamic random access memory (DRAM) to enhance data out (EDO) dynamic random access memory, and further to the currently widely applied synchronous dynamic random access memory (SDRAM). Each transmutation provides a great enhancement in access speed of the memory system. Most of the high-speed buses employ a source synchronous design such as the AGP Bus, the double data rate dynamic random access memory (DDR DRAM), and the RAMBUS. In addition, as a high data transmission speed requires a set of complementary data strobe signals, combination of the source synchronous design and provision of a set of complementary data strobe signals have become a leading trend in memory system design.

The market for dynamic random access memory system is still enormous. Generally speaking, a macro-revolution of this product takes three to five years. Thus, the speed of performance enhancement for a memory system relative to the growth of data transmission between microprocessor and storage device or microprocessor and graphic apparatus is slow. Especially in the use of the Internet, where a significant amount of data transmission is required, the inferior memory bandwidth seriously degrades the sensory enjoyment of the users.

FIG. 1 is a block diagram showing a conventional memory system on a mother board. The control chip set 100 is directly coupled to a memory module 140. The control chip set 100 and the memory module 140 use the same system clock as the reference for data transmission speed. Being limited by the current dynamic random access memory, the control chip set 100 has to lower the speed of the read/write instruction and data transmission to complete the data read/write operation with a transmission speed allowed by the memory system.

SUMMARY OF THE INVENTION

The invention provides an apparatus for varying data access speed, so that the current standard dynamic random access memory system can have a multiple data transmission rate. In one embodiment of the invention, a buffer is provided. The buffer is coupled between a control chip set and several memory modules to disassemble the write data sent from the control chip set to the memory modules and to assemble the read data sent from the memory modules to the control chip set.

The invention provides an apparatus for varying data access speed. A single memory read/write interface sent from a memory is converted into a high speed complementary signal of source synchronous design.

The above apparatus can also isolate the electric connection between the control chip set and the memory module. The modulization of the system design is thus more flexible. For example, the consideration of sequence in layout design is easier.

The above apparatus can also reduce the pin counts with the bandwidth that maintains or increases data transmission speed. Therefore, the fabrication cost can be reduced, or the input/output (I/O) pins can be reserved for other applications.

In one embodiment of the invention, a buffer varying data access speed is provided. The buffer includes a phase lock loop circuit, a control chip set data I/O interface, a memory data I/O interface, a first-in-first-out (FIFO) memory from the control chip set to the memory, a FIFO memory from the memory to the control chip set, and a control signal generator. The phase lock loop circuit is responsible for generating various clock signals required for the buffer. The buffer is coupled to the control chip set and the memory modules. The write data from the control chip set is received by the FIFO memory from the control chip set to the memory. Thereby, the write data is disassembled and transmitted to the memory modules by the memory data I/O interface. The FIFO memory from the memory to the control chip set is responsible for receiving the read data from the memory modules. Once assembled by control chip set data I/O interface, the read data is then transmitted to the control chip set. The control signal generator generates proper read/write control and I/O control, so that the data transmission speed at the control chip set can be a multiple of the data transmission speed at the memory as expected. Alternatively, the phase lock loop circuit can be omitted by supplying the clock signals directly from the system.

With the above buffer, a respective memory module can be assembled to enhance the performance of the memory system to match data transmission speed of the microprocessor or other I/O interface.

Both the foregoing general description and the following detailed description are exemplary and explanatory only and are not restrictive of the invention, as claimed.

DESCRIPTION OF THE PREFERRED EMBODIMENTS

Figure 1:
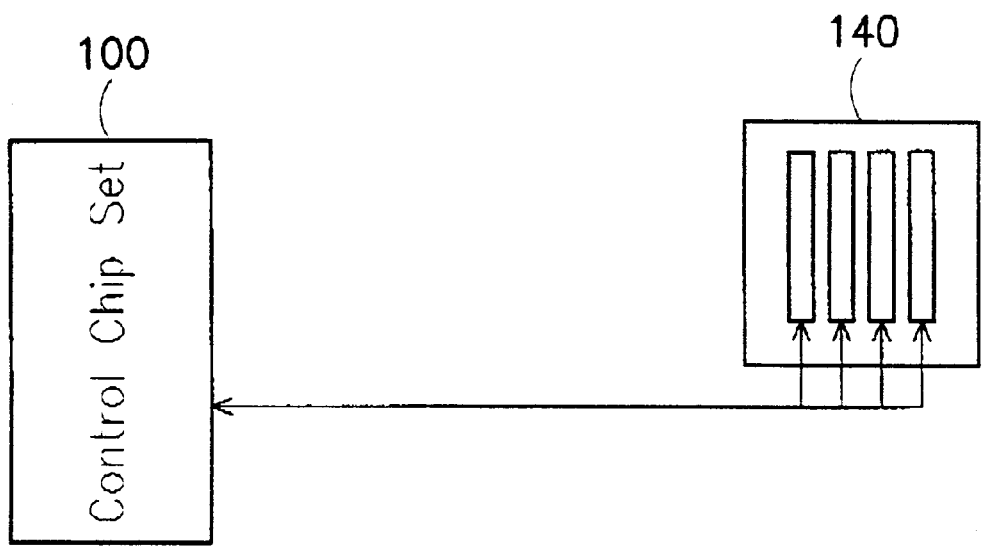
FIG. 1 is a block diagram showing a conventional memory system.
Figure 2:
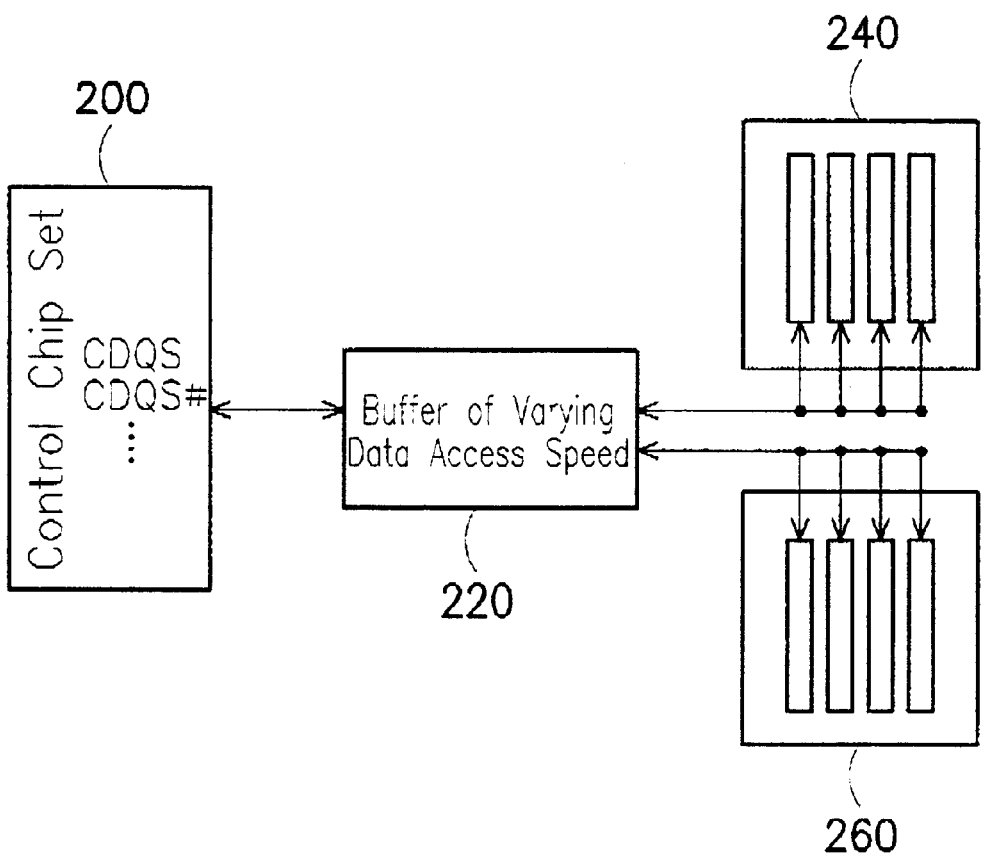
FIG. 2 shows the connection of a memory system in the first embodiment of the invention.

FIG. 2 is the first embodiment of the invention. A buffer 220 of varying data access speed and a system applying this buffer are illustrated. The buffer 220 is located between a control chip set 200 and memory modules 240 and 260 to provide a required data transmission speed at two sides of the system. The high bit memory module 240 and the low bit module 260 can be embedded with the same types of memories. In this embodiment, two double data rate dynamic random access memories are used as an example. The memory modules 240 and 260 are used to store data. When the control chip set 200 is to access the data of the memory modules 240 and 260, a read/write control instruction is output from the control chip set 200. In this embodiment, the output read/write control instruction is sent to the buffer 220 and the memory modules 240 and 260. For example, the control chip set 200 does not output the read/write control instruction to the memory modules 240 and 260 directly. Instead, a read/write control signal is output to the memory modules 240 and 260 by the buffer 220. Or alternatively, the control chip set 200 outputs two different read/write control instruction and read/write signal to the buffer 220 and the memory modules 240 and 260.

Figure 3:
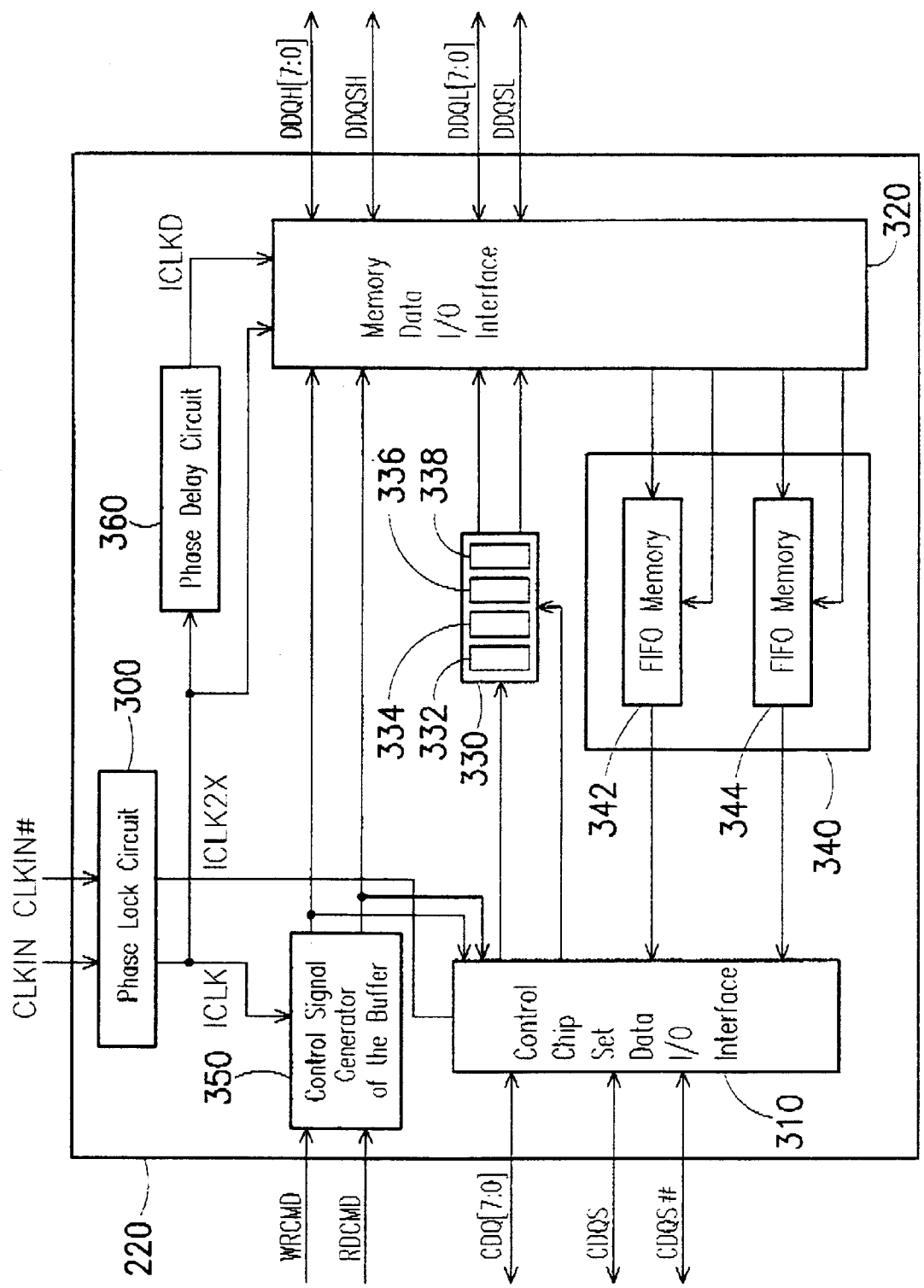
FIG. 3 shows a buffer in the first embodiment of the invention.

In FIG. 2, the control chip set 200 comprises a set of complementary data strobe signal pins CDQS and CDQS# to support the high data transmission speed between the control chip set 200 and the buffer 220. To save the resources of the I/O pin of the control chip set 200, the complementary data strobe signal pin CDQS# can share a common I/O pin with a data mask pin DQM#. FIG. 3 shows the first embodiment for 8 bits data buffer. The buffer 200 for varying data access speed comprises a phase lock loop circuit 300, a phase delay circuit 360, a control chip set data I/O interface 310, a memory data I/O interface 320, a FIFO memory from the control chip set to the memory 330, a FIFO memory from the memory to the control chip set 340, and a control signal generator 350.

As shown in FIG. 3, the buffer 220 comprises pins CLKIN and CLKIN# to provide a set of complementary external system clocks for the buffer, a set of data strobe signal pins CDQS and CDQS# from the control chip set 200, read/write instruction pins WRCMD and RDCMD from the control chip set, and 8 bits data bus pins CDQ[7:0]. The 8 bits data bus pins CDQ[7:0] are responsible for the data transmission between the control chip set 200 and the buffer 220. In addition, the buffer 220 further comprises a data strobe signal pin DDQSH from the high bit memory module 240, a data strobe signal pin DDQSL from the low bit memory module 260, and two 8 bits data bus pins DDQH[7:0] and DDQL[7:0] to provide the data transmission between the buffer 220 and the memory modules 240 and 260.

Referring to FIG. 3, the phase lock loop circuit 300 receives the external system clock CLKIN to generate an internal system clock ICLK with the same frequency and an internal multi-frequency system clock with a multiple of the frequency of the external system clock. In this embodiment, the multi-frequency system clock is two times the frequency of the external system clock. Therefore, this multi-frequency system clock is named ICLK2X. The above phase lock loop circuit 300 can be omitted when the multi-frequency system clock is generated by the system.

The FIFO memory from the control chip set to the memory 330 in the buffer 220 receives the data to be written into the memory modules 240 and 260 from the control chip set 200. The data transmission rate is four times the external system clock CLKIN. The FIFO memory from the memory to the control chip set 340 receives the data to be read by the control chip set 200 from the memory modules 240 and 260. The data transmission rate is two times the external system clock CLKIN. The interior of FIFO memory from the memory to the control chip set 340 can be divided into two FIFO memories 342 and 344 to receive data from the high bit memory module 240 and the low bit memory module 260, respectively. If the access time for the data strobe signal CDQS is longer, a FIFO memory from the memory to the control chip set 340 with a longer depth is required. The control signal generator 350 of the buffer 220 receives the external signals RDCMD and WRCMD to generate a input/output control signal and a read/write control signal for the data input/output control of the internal FIFO memories 330 and 340.

Figure 4:
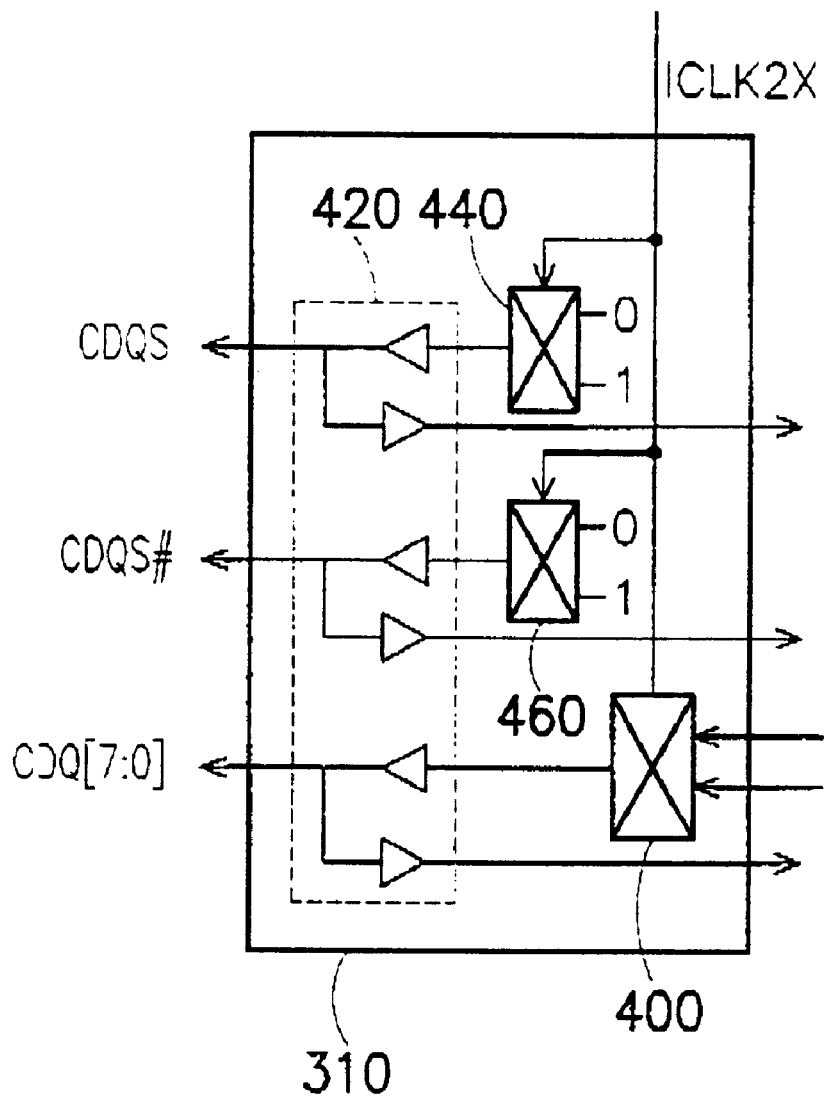
FIG. 4 is a schematic drawing showing an internal structure of a control chip set data I/O interface according to the first embodiment of invention.

In FIG. 4, the control chip set data I/O interface 310 comprises an I/O control circuit 420 and three multiplexors 400, 440 and 460. The multiplexor 400 is controlled by the internal multi-frequency clock signal ICLK2X. According to the level of the clock signal ICLK2X, the data from either the FIFO memory 342 or 344 is selected. Therefore, the data transmission rate in this part is four times of the external system clock. The multiplexors 440 and 460 are controlled by the same clock signal CLK2X. The function thereof is to balance the sequence difference between CDQ[7:0], CDQS and CDQS#.

As shown in FIG. 3, the buffer 220 comprises a phase delay circuit 360 to receive the internal clock signal ICLK and to generate an internal delay clock signal ICLKD with a ¼ phase delay to provide the time reference of the memory data I/O interface 320.

Figure 5:
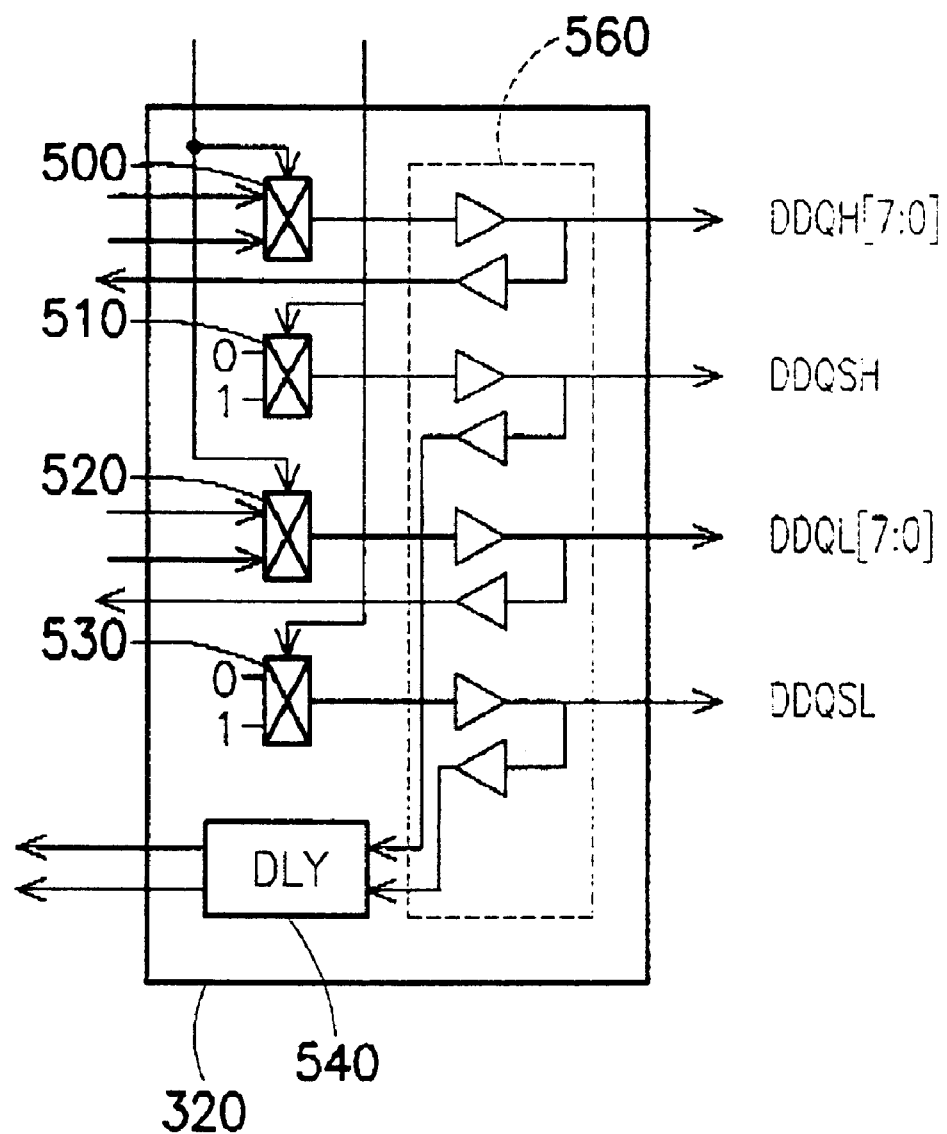
FIG. 5 is a schematic drawing showing an internal structure of a memory data I/O interface according to the first embodiment of the invention.

In FIG. 5, the memory data I/O interface 320 comprises an I/O control circuit 560, a delay circuit 540 and four multiplexors 500, 510, 520 and 530. The multiplexor 500 is controlled by the internal clock signal ICLK to select the data from either FIFO series 332 or FIFO series 336 to the high bit memory module 240. Also, the multiplexor 520 is controlled by the same internal clock signal ICLK to select the data from either FIFO series 334 or FIFO series 338 to the low bit memory module 260. The data transmission rate of this part is thus two times the external system clock CLKIN. The multiplexors 510 and 530 are controlled by the internal clock signal ICLKD with the function of balancing the sequence difference between DDQH, DDQL, DDQSH and DDQSL. While reading the double data rate dynamic random access memory, the internal delay clock signal ICLKD is provided for the sequence control of the delay circuit 540. While writing the double data rate dynamic random access memory, the internal delay clock signal ICLKD is provided for the sequence control of the multiplexor 510 and 530.

If the control chip set 200 activates a read instruction to the memory modules 240 and 260, the read instruction RDCMD is transmitted to the buffer 220. Meanwhile, the synchronous dynamic random access memory instructions CS#, SRAS, SCAS, SWE, and address MA are simultaneously transmitted to the high and low bit memory modules 240 and 260. The buffer 220 receives the data strobe signals DDQSH and DDQSL from the memory modules and locks the high bit data DDQH[7:0] and low bit data DDQL[7:0] into the FIFO memories 342, 344 via the delay circuit with ¼ phase delay. The buffer 220 then generates the complementary data strobe signals CDQS and CDQS# with four times the speed. Simultaneously, the data output CDQ[7:0] receives the internal multi-frequency clock signal ICLK2X to select data from the memories 342 and 344. The complementary data strobe signals CDQS and CDQS# with four times the speed provide the voltage and clock reference required by the receiving circuit of the control chip set 200. If the control chip set 200 activates a write instruction to the memory modules 240 and 260, the write instruction WRCMD is transmitted to the buffer 220. Meanwhile, the synchronous dynamic random access memory instructions CS#, SRAS, SCAS, SWE, and address MA are simultaneously transmitted to the high and low bit memory modules 240 and 260. The buffer 220 receives the complementary data strobe signals CDQS and CDQS# from the control chip set 200 and locks the data CDQ[7:0] into the FIFO memory 330. The data transmission rate is four times the external system clock CLKIN. The buffer 220 then generates the data strobe signal DDQSH and DDQSL corresponding with the specification of the double data rate random access memory transmission to transmit the data DDQH[7:0] and DDQL[7:0] into the high and low bit memory modules 240 and 260 respectively.

Figure 6:
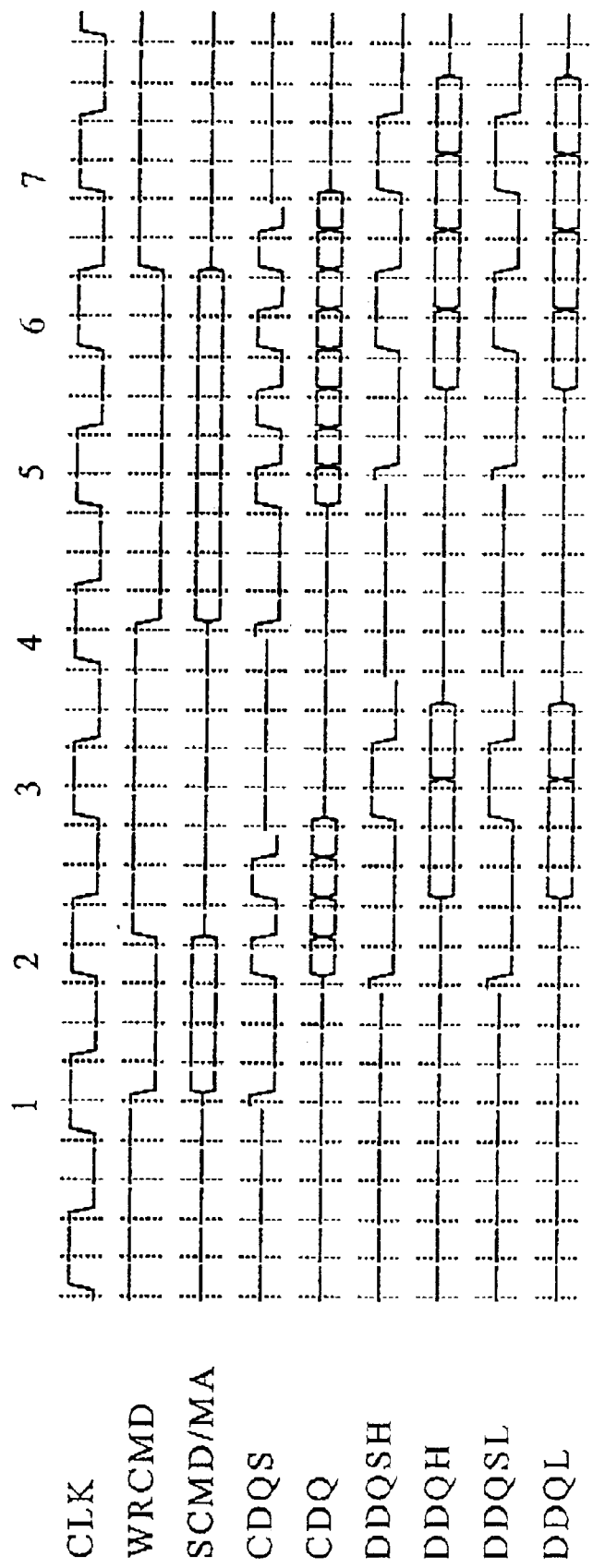
FIG. 6 shows a sequence diagram of the written data of the memory system according to the first embodiment of the invention.
Figure 7:
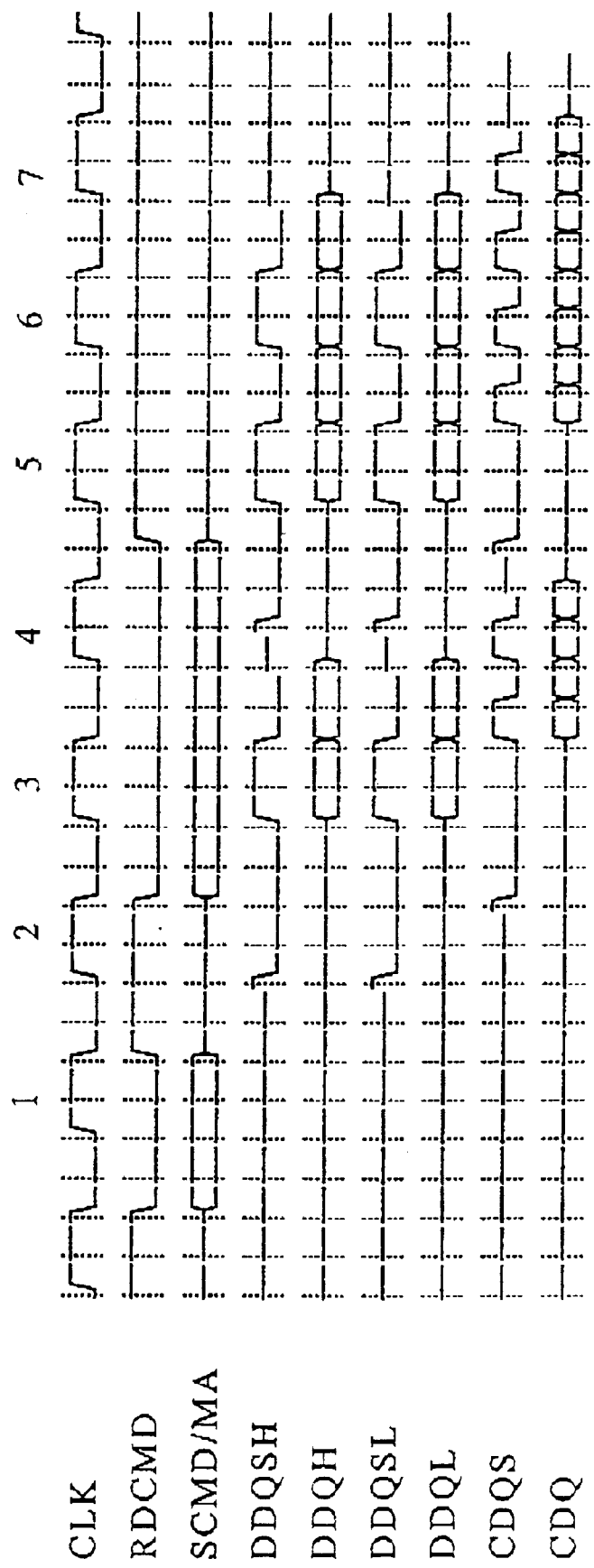
FIG. 7 shows a sequence diagram of the read data of the memory system according to the first embodiment of the invention.

FIG. 6 shows a data write sequence diagram of the memory system. FIG. 7 shows a data read sequence diagram of the memory system. In FIGS. 6 and 7, with the exception of the instruction and address signal denoted as SCMD/MA, the signals can all be obtained from the above description. Therefore, the buffer 220 for varying data rate doubles the data transmission rate of the current double data rate synchronous dynamic random access memory system.

Figure 8:
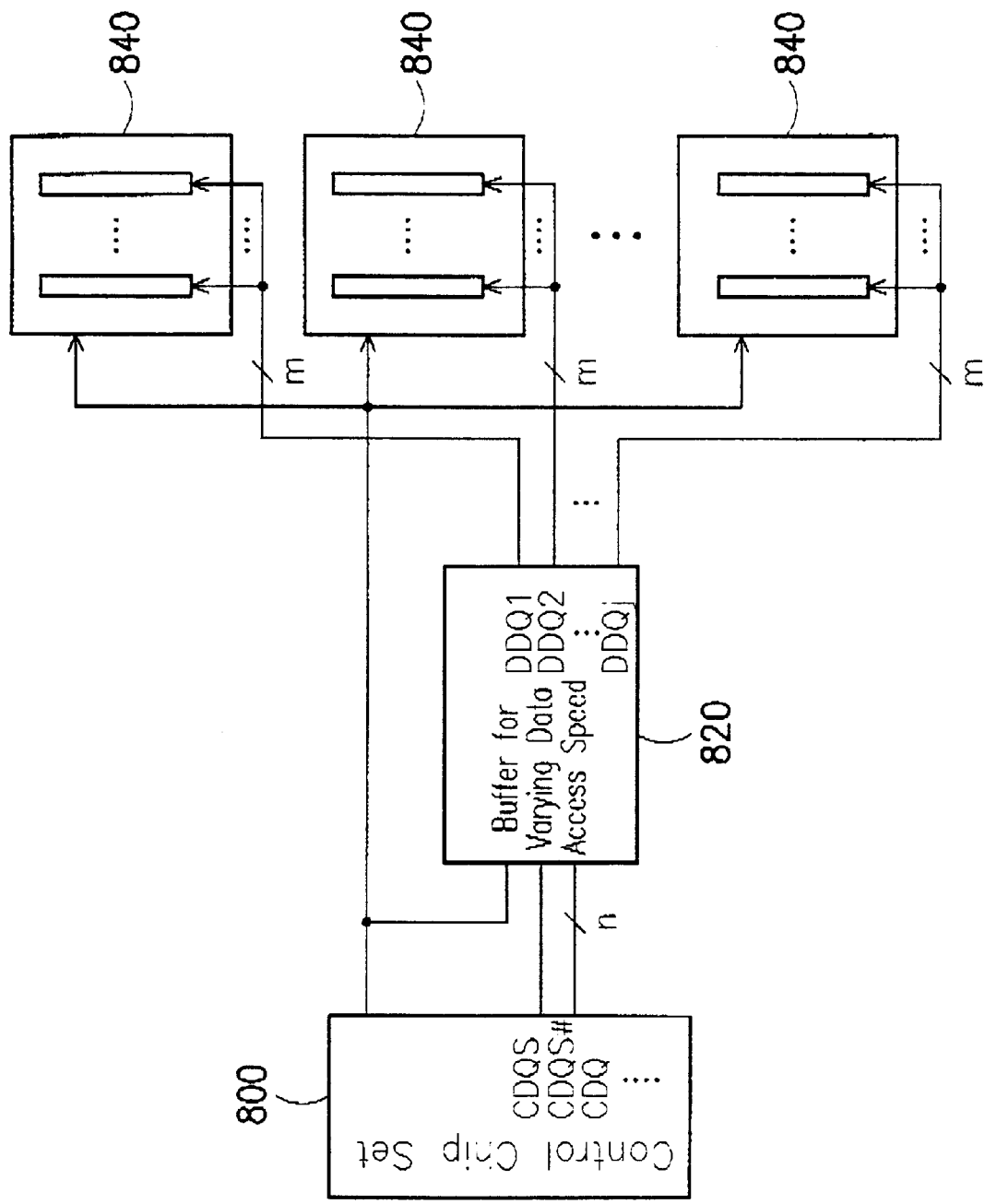
FIG. 8 shows the connection of a memory system in the second embodiment of the invention.

It is appreciated that, according to the above embodiment, people of ordinary skill in the art may reduce or maintain the data bits of the control chip set to increase the data transmission rate. On the other hand, the data bits of the memory modules can be divided into several sets. The number of data bits of the memory modules does not have to be identical to that of the control chip set. FIG. 8 shows the connection of the memory system in the second embodiment of the invention. In this figure, a system including j sets of memory modules 840, a control chip set 800 and a buffer 820 is illustrated.

The j sets of memory modules can be the same type of double data rate synchronous dynamic random access memories or memories with other standards. To reduce the cost of data storage, each set of the memory modules 840 comprising m data bits is coupled to the buffer 820. Also, the control chip set 800 comprising n data bits is coupled to the buffer 820. The data access rate of the control chip set 800 is i times of the data access rate that the memory modules 840 have. When the data of the memory modules 840 is accessed by the control chip set 800, a read/write instruction is output from the control chip set 800 to the memory directly. The buffer 820 accesses data that matches the data access rate of the control chip set 800 and correctly accesses the data that matches the data access rate of the memory modules 840.

The above n, m, i and j are all integers, and i, j>=2. As the actual amount of input/output data is the same, n, m, i and j have to meet the following requirement: i*n=m*j. In the first embodiment, the multiple of data access rate compares with the double data rate synchronous random access memory is 2, that is, i=2. The number of data bits of the memory modules can be 8, that is, m=8. The memory modules can be divided into two, that is, j=2. The number of data bits of the control chip set is 8, that is, n=8. In another example, the multiple of the data rate compares with data access rate of the memory module can be 8, that is, i=8, while the number of data bits of the memory module is 16, that is m=16, and there are 4 memory modules, that is j=4. The number of data bits of the control chip set is only 8, that is, n=8.

From the above embodiment, the buffer 820 for varying the data rate comprises the memory data I/O interface coupled to the memory modules, the control chip set data I/O interface coupled to the control chip set, the first and second FIFO memories coupled between the memory data I/O interface and the control chip set data I/O interface, and the control signal generator.

The control signal generator is coupled to the memory data I/O interface, the control chip set data I/O interface, the first and second FIFO memories, and the control chip set. The control signal generator is used to decode the read/write instruction from the control chip set 800 and to generate the read/write control signal. The data access rate of the control chip set data I/O interface is i times that of the memory data I/O interface. The above-mentioned n, m, i, j are all integers, and i, j>2, i*n=m*j.

The first and second FIFO memories function as temporary storage units under different data access rates. The read/write control signal controls the first and second FIFO memories, so that the first FIFO memory receives the write data from the control chip set data I/O interface, and then transmits the write data to the memory data I/O interface. The second FIFO memory receives the read data from the memory data I/O interface, and then transmits the read data to the control chip set data I/O interface.

Each memory module in this embodiment can receive the memory clock signal with the same frequency. The buffer 820 may further comprises a phase lock loop circuit to generate the buffer clock signal and the multiple buffer clock signal. The buffer clock signal has the same frequency as the memory clock signal. The multiple buffer clock signal has a frequency which is i times of the frequency of the memory clock signal. The control signal generator of the buffer receives the buffer clock signal and the multiple buffer clock signal to generate the correct sequence control signal.

Figure 9:
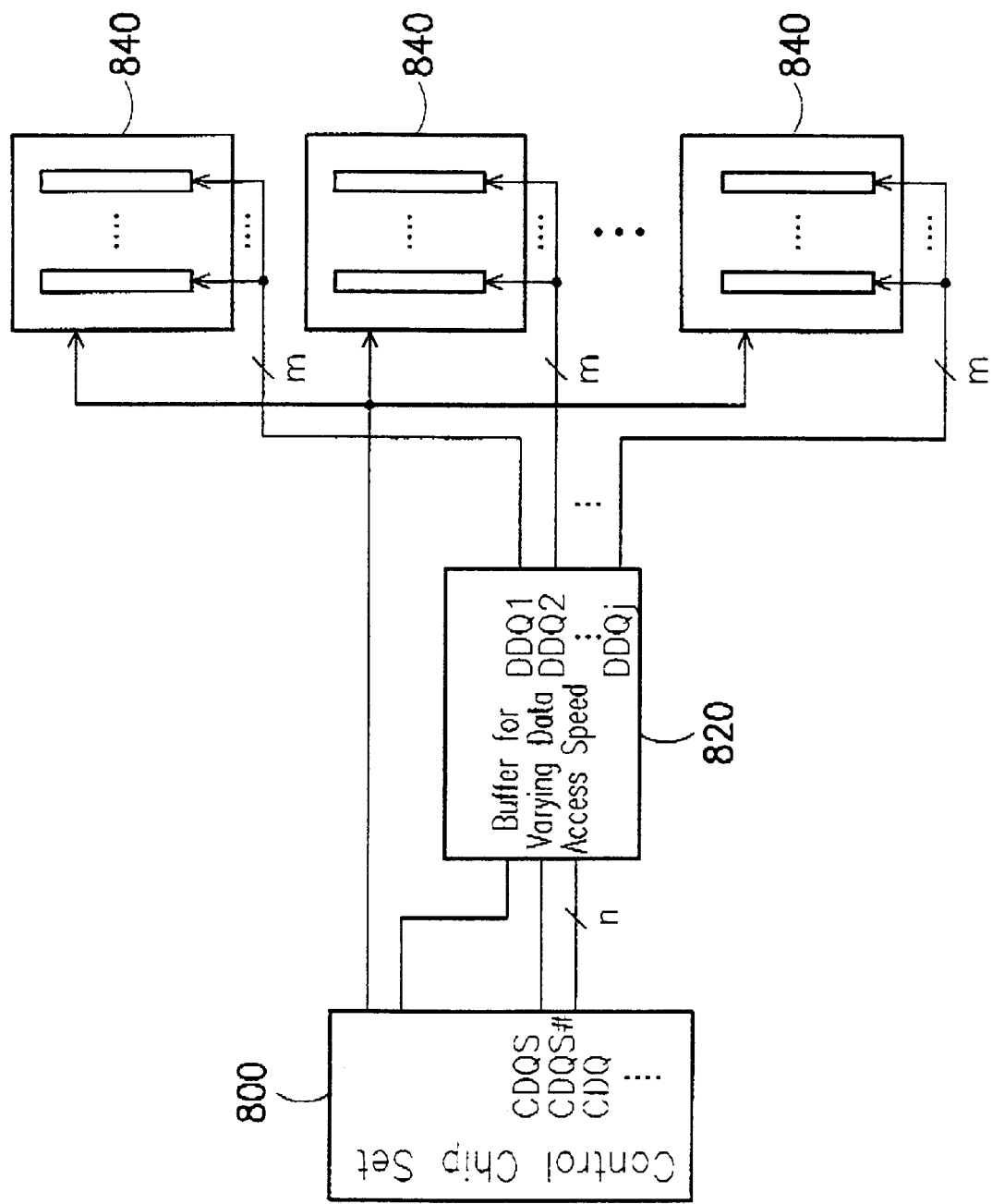
FIG. 9 shows the connection of a memory system in the third embodiment of the invention.
Figure 10:
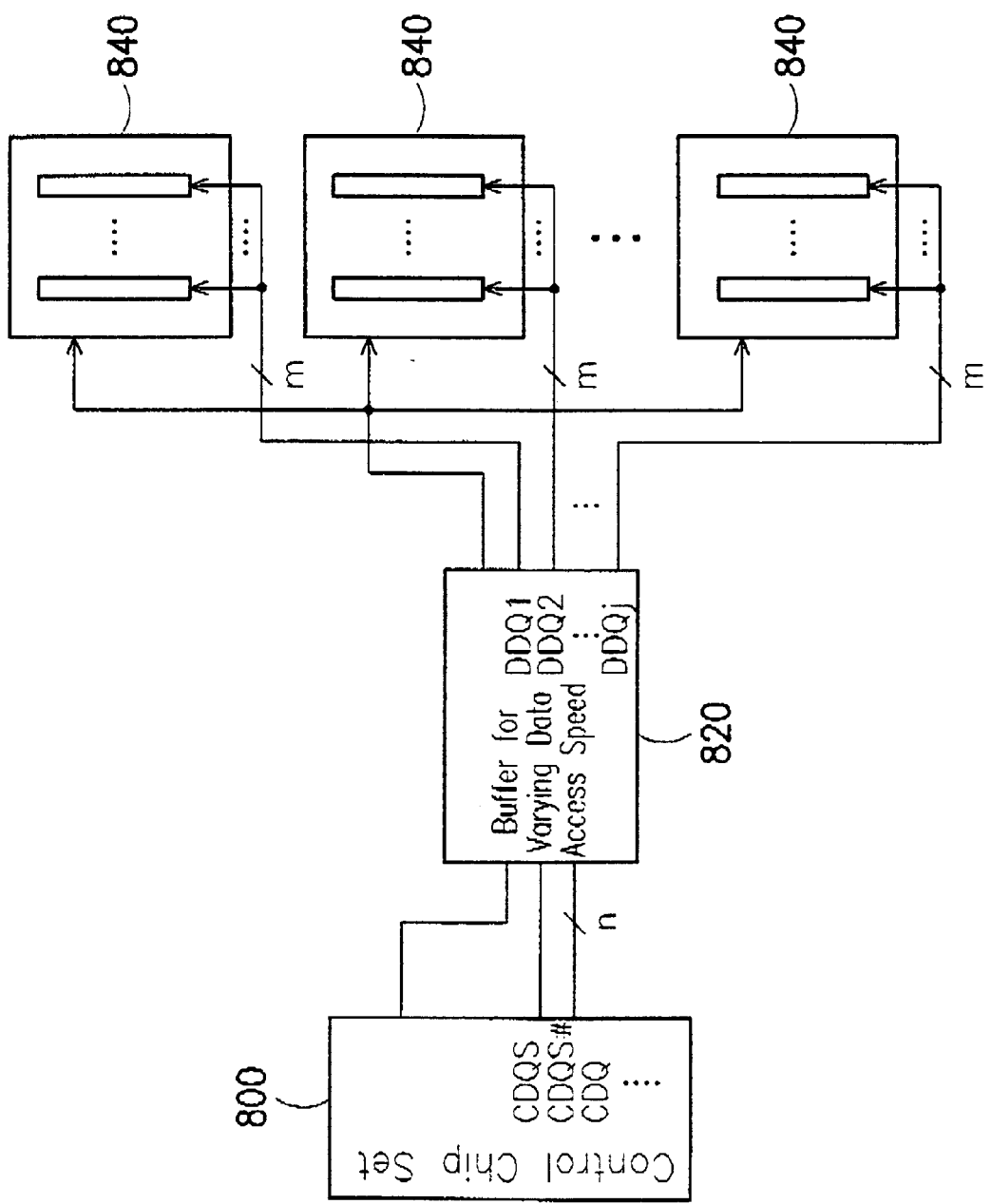
FIG. 10 shows the connection of a memory system in the fourth embodiment of the invention.

FIG. 9 and FIG. 10 show the connections of another two embodiments of the invention. In the embodiment shown in FIG. 8, in addition to sending the read/write control signal to the buffer 820, the control chip set 800 also sends the read/write control signal to the memory modules 840. In the third embodiment as shown in FIG. 9, the control chip set 800 outputs two different sets of read/write control signals to the buffer 820 and the memory modules 840. In the fourth embodiment as shown in FIG. 10, the control chip set 800 does not output the read/write control signal to the memory modules 840 directly. Instead, a control signal is output to the memory modules 840 from the buffer 820.

Figure 11:
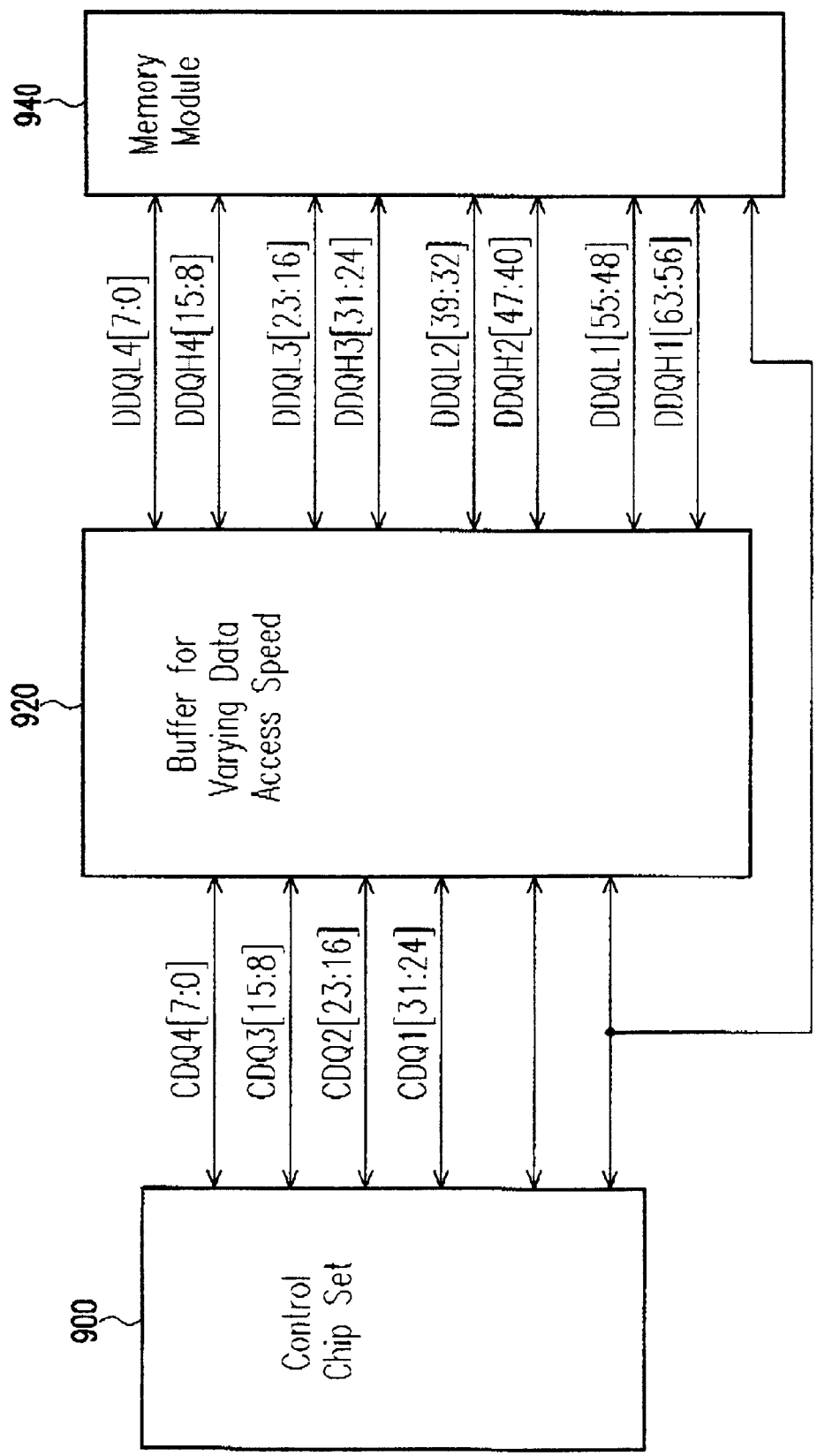
FIG. 11 shows the connection of a memory system in the fifth embodiment of the invention

Furthermore, the number of the memory module is not limited. In the fifth embodiment as shown in FIG. 11, only one memory module 940, such as double data rate synchronous random access memory, is used in the invention. In this embodiment, both the memory module 940 and the control chip set 940 are coupled to the buffer 920. The memory module 940 is divided 64 data bits into 8 sets of 8 data bits named DDQL4[7:0], DDQH4[15:8], DDQL3[23:16], DDQH3[31:24], DDQL2[39:32], DDQH2[47:40], DDQL1[55:48], and DDQH1[63:56]. The control chip set 900 has 32 data bits divided into 4 sets of 8 data bits named CDQ4[7:0], CDQ3[15:8], CDQ2[23:16], and CDQ1[31:24]. In the reading operation, the CDQ4[7:0] receives the data from either the DDQL4[7:0] or the DDQH[15:8] assembled by the buffer 920, and so do the CDQ3[15:8], CDQ2[23:16], and CDQ1[31:24]. In the writing operation, the data in DDQL4[7:0] and DDQH4[15:8] receive the data from CDQ4[7:0] disassembled by the buffer 920, so do the DDQL3[23:16], DDQH3[31:24], DDQL2[39:32], DDQH2 [47:40], DDQL1[55:48], and DDQH1[63:56 ].

As the actual amount of input/output data is the same, n, m, i and j also can meet the above requirement: i*n=m*j. In the fifth embodiment, the multiple of data access rate compares with the double data rate synchronous random access memory is 2, that is, i=2. The number of data bits of the memory modules can be 64, that is, m=64. The memory modules is one, that is, j=1. The number of data bits of the control chip set is 32, that is, n=32. In this way, not only the pin count of the control chip set 900 can be reduced but also the data access rate of the control chip set 900 can be increased 2 times higher than the data access rate of the memory module 940. Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A buffer for varying data access speed, coupled to a high bit memory module, a low bit memory module and a control chip set, wherein the high bit memory module and the low bit memory module receive a memory clock signal, the buffer comprising:
    a memory data input/output interface, coupled to the high bit memory module and the low bit memory module;
    a control chip set data input/output interface, coupled to the control chip set;
    a first first-in-first-out memory, coupled to the control chip set data input/output interface and the memory data input/output interface;
    a second first-in-first-out memory, coupled to the control chip set data input/output interface and the memory data input/output interface; and
    a control signal generator, coupled to the memory data input/output interface, the control chip set data input/output interface, the first first-in-first-out memory, the second first-in-first-out memory and the control chip set, the control signal generator receiving a buffer clock signal and a multiple buffer clock signal, the buffer clock signal having a frequency equal to the frequency of the memory clock signal, and the multiple buffer clock signal having a frequency which is a predetermined multiple of the frequency of the memory clock signal, the control signal generator decoding a read/write instruction from the control chip set and generating a read/write control signal; wherein
    the control chip set data input/output interface has a data transmission rate which is the predetermined multiple of a data transmission rate of the memory data input/output interface, the first and second first-in-first-out memories function as temporary storage units between different data transmission rates, the read/write control signal controls the first and the second first-in-first-out memories, so that the first-in-first-out memory receives a write data from the control chip set and outputs the write data to the memory data input/output interface, and the second first-in-first-out memory receives a read data from the memory data input/output interface and outputs the read data to the control chip set data input/output interface.

2. The buffer according to claim 1, wherein the second first-in-first-out memory comprises:
    a third first-in-first-out memory, coupled to the memory data input/output interface and the control chip set data input/output interface to receive a high bit read data, wherein the high bit read data is data transmitted from the high bit memory module; and
    a fourth first-in-first-out memory, coupled to the memory data input/output interface and the control chip set data input/output interface to receive a low bit read data, wherein the low bit data is data transmitted from the low bit memory module.

3. The buffer according to claim 2, wherein the control chip set data input/output interface further comprises a multiplexor coupled to the third and fourth first-in-first-out memories, the multiplexor receives the multiple buffer clock signal to select either the low bit read data or the high bit read data to transmit to the control chip set.

4. The buffer according to claim 1, wherein the control signal generator further generates an input/output control signal which is transmitted to the memory data input/output interface and the control chip set data input/output interface as a time standard for data input/output control.

5. The buffer according to claim 1, wherein the first first-in-first-out memory comprises a first first-in-first-out queue, a second first-in-first-out queue, a third first-in-first-out queue and a fourth first-in-first-out queue connected serially between the memory data input/output interface and the control chip set data input/output interface for disassembling and storing the write data into the first first-in-first-out queue, the second first-in-first-out queue, the third first-in-first-out queue, and the fourth first-in-first-out queue.

6. The buffer according to claim 5, wherein the memory data input/output interface comprises:
    a high bit data multiplexor, coupled to the first first-in-first-out memory, the high bit data multiplexor receiving the buffer clock signal to select either data of the first first-in-first-out series or data of the third first-in-first-out series to output to the high bit memory module; and
    a low bit data multiplexor, coupled to the first first-in-first-out memory, the low bit data multiplexor receiving the buffer clock signal to select either data of the second first-in-first-out series or data of the fourth first-in-first-out series to output to the low bit memory module.

7. The buffer according to claim 1, wherein the buffer further comprises:
    a phase lock loop circuit, to generate the buffer clock signal and the multiple buffer clock signal; and
    a phase delay circuit, coupled to the phase lock loop circuit and the memory data input/output interface to generate a delay buffer clock signal, wherein the delay buffer clock signal and the buffer clock signal have the same frequency with a predetermined phase difference.

8. The buffer according to claim 7, wherein the predetermined phase difference is ¼ phase.

9. The buffer according to claim 1, wherein the memory data input/output interface further comprises a delay circuit to generate a data strobe signal with a ¼ phase delay.

10. The buffer according to claim 1, wherein the control chip set further comprises:
    a set of complementary data strobe pins, to support the second data access speed between the control chip set and the buffer.

11. The buffer according to claim 10, wherein one of the complementary data strobe pins shares a common input/output pin with a data mask pin.

12. The buffer according to claim 1, wherein each of said at least memory module is a double data rate dynamic random access memory.

13. A system for varying data access speed, comprising:
at least one memory module having a first data access speed, wherein said at least one memory comprises a high bit memory module and a low bit memory module receiving a memory clock signal;
a control chip set having a second data access speed, which is a predetermined multiple of the first data access speed; and
a buffer, coupled to the at least one memory module and the control chip set, a data access between the buffer and the control chip set with the second data access speed, and the data access between the buffer and the at least one memory module with the first data access speed,
wherein the buffer comprises:
a first first-in-first-out memory, coupled between the memory module and the control chip set;
a second first-in-first-out memory, coupled between the memory module and the control chip set; and
a control signal generator, wherein the control signal generator receives a buffer clock signal and a multiple buffer clock signal corresponding to the first data access speed and the second data access speed,
wherein according to the two data access speeds, the first and second first-in-first-out memories are controlled by the control signal general generator and function as temporary storage units between different data access speeds.

14. The system according to claim 13, wherein the buffer comprises:
a memory data input/output interface, coupled to the high bit memory module and the low bit memory module; and
a control chip set data input/output interface, couple to the control chip set;
wherein the first first-in-first-out memory, coupled to the control chip set data input/output interface and the memory data input/output interface;
the second first-in-first-out memory, coupled to the control chip set data input/output interface and the memory data input/output interface; and
the control signal generator, coupled to the memory data input/output interface, the control chip set data input/output interface, the first-in-first-out memory, the second first-in-first-out memory and the control chip set, the control signal generator receiving the buffer clock signal and the multiple buffer clock signal, the buffer clock signal having a frequency equal to the frequency of the memory clock signal, and the multiple buffer clock signal having a frequency which is the predetermined multiple of the frequency of the memory clock signal, the control signal generator decoding a read/write instruction from the control chip set and generating a read/write control signal; wherein
according to the multiple buffer clock signal and the buffer clock signal, the control chip set data input/output interface has the second data access speed, the memory data input/output interface has the first data access speed, the read/write control signal controls the first and the second first-in-first-out memories, so that the first first-in-first-out memory receives a write data from the control chip set and outputs the write data to the memory data input/output interface, and the second first-in-first-out memory receives a read data from the memory data input/output interface and outputs the read data to the control chip set data input/output interface.

15. The system according to claim 14, wherein the first first-in-first-out memory comprises:
a third first-in-first-out memory, coupled to the memory data input/output interface and the control chip set data input/output interface to receive a high bit read data, wherein the high bit read data is data transmitted from the high bit memory module; and
a fourth first-in-first-out memory, coupled to the memory data input/output interface and the control chip set data input/output interface to receive low bit read data, wherein the low bit data is data transmitted from the a low bit memory module.

16. The system according to claim 14, wherein the control chip set data input/output interface further comprises a multiplexor coupled to the third and fourth first-in-first-out memories, and the multiplexor receives the multiple buffer clock signal to select either the low bit read data or the high bit read data to transmit to the control chip set.

17. The system according to claim 14, wherein the control signal generator further generates an input/output control signal which is transmitted to the memory data input/output interface and the control chip set data input/output interface as a time standard for data input/output control.

18. The system according to claim 14, wherein the first first-in-first-out memory comprises a first first-in-first-out series, a second first-in-first-out series, a third first-in-first-out series and a fourth first-in-first-out series connected serially between the memory data input/output interface and the control chip set data input/output interface for disassembling the write data and storing into the first first-in-first-out series, the second first-in-first-out series, the third first-in-first-out series and the fourth first-in-first-out series.

19. The system according to claim 18, wherein the memory data input/output interface comprises:
a high bit data multiplexor, coupled to the first first-in-first-out memory, the high bit data multiplexor receiving the buffer clock signal to select either data of the first first-in-first-out series or data of the third first-in-first-out series to output to the high bit memory module; and
a low bit data multiplexor, coupled to the first first-in-first-out memory, the low bit data multiplexor receiving the buffer clock signal to select either data of the second first-in-first-out series or data of the fourth first-in-first-out series to output to the low bit memory module.

20. The system according to claim 14, wherein the buffer further comprises:
a phase lock loop circuit, to generate the buffer clock signal and the multiple buffer clock signal; and
a phase delay circuit, coupled to the phase lock loop circuit and the memory data input/output interface to generate a delay buffer clock signal, wherein the delay buffer clock signal and the buffer clock signal have the same frequency with a predetermined phase difference.

21. The system according to claim 20, wherein the predetermined phase difference is ¼ phase.

22. The system according to claim 14, wherein the memory data input/output interface further comprises a delay circuit to generate a data strobe signal with a ¼ phase delay.

23. The system according to claim 13, wherein the control chip set further comprises:
a set of complementary data strobe pins, to support the second data access speed between the control chip set and the buffer.

24. The system according to claim 23, wherein one of the complementary data strobe pins shares a common input/output pin with a data mask pin.

25. The system according to claim 13, wherein each of said at least memory module is a double data rate dynamic random access memory.

26. The system according to claim 13, wherein said at least one memory module is a memory module having m data bits, the control chip set has n data bits, and a predetermined multiple is i; thereby, a relationship among the m data bits of the memory module, the n data bits of the control chip set, and the predetermined multiple i is that m equals to i times n.

27. A buffer for varying data access speed, coupled to j sets of memory modules and a control chip set, wherein each set of the memory modules comprises m data bits and the control chip set comprises n data bits, the buffer comprising:
a memory data input/output interface, coupled to the memory modules;
a control chip set data input/output interface, coupled to the control chip set;
a first first-in-first-out memory, coupled to the control chip set data input/output interface and the memory data input/output interface;
a second first-in-first-out memory, coupled to the control chip set data input/output interface and the memory data input/output interface; and
a control signal generator, coupled to the memory data input/output interface, the control chip set data input/output interface, the first first-in-first-out memory, the second first-in-first-out memory and the control chip set, the control signal generator decoding a read/write instruction from the control chip set and then generating a read/write control signal; wherein
data of the control chip set data input/output interface having a data transmission rate i times of that of the memory data input/output interface, n, m, i, j are integers, i, j>2, i*n=m*j, the first and the second first-in-first-out memories function as temporary storage units between different data rates, the read/write control signal controls the first and the second first-in-first-out memories, so that the first first-in-first-out memory receives a write data from the control chip set data input/output interface and outputs to the memory data input/output interface, and the second first-in-first-out memory receives a read data from the memory data input/output interface and outputs the read data to the control chip set data input/output interface.

28. The buffer according to claim 27, wherein each set of the memory modules receives a memory clock signal, the control signal generator receives a buffer clock signal and a multiple buffer clock signal, the buffer clock signal and the memory clock signal have the same frequency, and the multiple buffer clock signal has a frequency which is i times of that of the memory clock signal.

29. The buffer according to claim 27, wherein the buffer further comprises a phase lock loop circuit receiving the memory clock signal to generate the buffer clock signal and the multiple buffer clock signal.

30. A system for varying data access speed, comprising:
j sets of memory modules having a first data access speed, and each set of memory module comprising m data bits;
a control chip set comprising n data bits, and the control chip set having a second data access speed, which is i times of the first data access speed; and
a buffer, coupled to the j sets of memory modules and the control chip set, a data accessing between the buffer and the control chip set with the second data access speed, and the data accessing between the buffer and the j sets of memory modules with the first data access speed; wherein n, m, i, j are integers, and i, j>2; and i*n=m*j 31. The system according to claim 30, wherein the control chip set outputs the read/write instruction to the buffer and the j sets of memory modules simultaneously.

32. The system according to claim 30, wherein the control chip set outputs the read/write instruction to the buffer and the j sets of memory modules, respectively.

33. The system according to claim 30, wherein the control chip set outputs the read/write instruction to the buffer, and the buffer outputs a read/write control signal to the j sets of memory modules.

* * * * *